(12) United States Patent
Chen et al.

(10) Patent No.: US 6,563,735 B1
(45) Date of Patent: May 13, 2003

(54) NOR-STRUCTURED SEMICONDUCTOR MEMORY DEVICE

(75) Inventors: Hsin-Chien Chen, Hsinchu (TW);
Gin-Liang Chen, Hsinchu (TW);
Hsin-Yi Ho, Hsinchu (TW);
Chun-Hsiung Hung, Hsinchu (TW);
Ho-Chun Liou, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/117,148

(22) Filed: Apr. 4, 2002

(51) Int. Cl.[7] ............................................. G11C 16/04
(52) U.S. Cl. ........................ 365/185.17; 365/185.13
(58) Field of Search ...................... 365/185.02, 185.13, 365/185.17, 103, 104

(56) References Cited

U.S. PATENT DOCUMENTS

| | | | | |
|---|---|---|---|---|
| 5,726,929 A | * | 3/1998 | Suminaga et al. | 365/104 |
| 5,909,405 A | * | 6/1999 | Lee et al. | 365/230.03 |
| 6,088,277 A | * | 7/2000 | Kim et al. | 365/104 |
| 6,147,912 A | * | 11/2000 | Kitazawa | 365/189.02 |
| 6,496,405 B2 | * | 12/2002 | Hibino | 365/104 |

* cited by examiner

Primary Examiner—Son Mai
(74) Attorney, Agent, or Firm—Martine & Penilla, LLP

(57) ABSTRACT

A NOR-structured semiconductor memory device with a novel configuration of bit line connection is disclosed. The NOR-structured semiconductor memory device comprises a semiconductor memory cell array electrically connected to a plurality of bit lines. The plurality of bit lines are divided into at least four bit line groups. At least two bit lines of each bit line group are coupled to a main bit line through at least two bit line transistors, respectively. Furthermore, the bit lines of the NOR-structured semiconductor memory device are arranged in such a way that at least four adjacent bit lines thereof are selected from four different bit line groups and coupled to four different main bit lines, respectively. During a programming or data reading operation, two adjacent bit lines of the four adjacent bit lines are supplied with a programming voltage or sense current while the other two adjacent bit lines are grounded. Therefore, the NOR-structured semiconductor memory device successfully prevents the programming disturbance or correctly determines the data stored in memory cells at a high speed because no leakage current path is formed.

7 Claims, 3 Drawing Sheets

NOR-STRUCTURED SEMICONDUCTOR MEMORY DEVICE

BACKGROUND OF THE INVENTION

A. Field of the Invention

The present invention relates to a semiconductor memory device and, more particularly, to a NOR-structured semiconductor memory device with a novel configuration of bit line connection.

B. Description of the Related Art

FIG. 1 is a schematic diagram showing a conventional NOR-structured semiconductor memory device 1. For the sake of descriptive simplicity, the conventional NOR-structured memory device 1 shown in FIG. 1 includes a 2×8 memory cell array whose memory cells are electrically connected to corresponding word lines and bit lines. More specifically, the memory cells arranged in a row are electrically connected in parallel to a word line while the memory cells arranged in a column are electrically connected in parallel to two adjacent bit lines. For example, memory cells M10 to M17 are arranged in such a way that the gate electrodes of them are electrically connected in parallel to a word line WL1. Memory cells M10 and M00 are arranged in such a way that the channel electrodes (i.e., source and drain electrodes) of them are electrically connected in parallel to two adjacent bit lines BL0 and BL1, respectively.

Referring to FIG. 1, bit lines BL0 and BL2 are coupled to a main bit line MBL0 through bit line transistors BLT0 and BLT1, respectively. Bit lines BL1 and BL3 are coupled to a main bit line MBL2 through bit line transistors BLT4 and BLT5, respectively. The bit line transistors BLT0, BLT1, BTL4, and BLT5 may be N-type MOS (Metal-Oxide-Semiconductor) transistors and become conductive or non-conductive in response to selection signals input from selection lines SEL0, SEL1, SEL2, and SEL3, respectively. Similarly, bit lines BL4 and BL6 are coupled to a main bit line MBL1 through bit line transistors BLT2 and BLT3, respectively, while bit lines BL5 and BL7 are coupled to a main bit line MBL3 through bit line transistors BLT6 and BLT7, respectively. The bit line transistors BLT2, BLT3, BTL6, and BLT7 may be N-type MOS transistors and become conductive or non-conductive in response to selection signals input from selection lines SEL0, SEL1, SEL2, and SEL3, respectively.

The memory cells M00 to M07 and M10 to M17 may be programmable memory devices such as EPROM (Erasable Programmable Read Only Memory) or Flash EEPROM. In this case, the programming operation of a selected memory cell in the conventional NOR-structured memory device is described as follows. To program the memory cell M00 for example, the word line WL0 is activated and the selection lines SEL0 and SEL2 are activated to turn on the bit line transistors BLT0 and BLT4. In addition, the selection lines SEL1 and SEL3 are deactivated to turn off the bit line transistors BLT1 and BLT5. At the same time, the main bit line MBL2 is supplied with a high programming voltage and the main bit lines MBL0, MBL1, and MBL3 are all grounded. Therefore, the memory cell M00 is programmed through a current path L1 consisting of the main bit line MBL2, the bit line transistor BLT4, the bit line BL1, the bit line BL0, and the bit line transistor BLT0, and the main bit line MBL0.

During the programming operation of the memory cell M00, however, the memory cells M01, M02, M03, and M04 are simultaneously activated by the word line WL1 and subject to programming disturbance by the high programming voltage from the main bit line MBL2 since two other current paths L2 and L3 are formed as shown in FIG. 1. Therefore, it is desirable to provide a NOR-structured semiconductor memory device capable of preventing the programming disturbance during the programming operation.

There is also a problem in the conventional NOR-structured semiconductor memory device during the data reading operation. To read the data stored in the memory cell M00 for example, a sense current is supplied to the main bit line MBL2. If the memory cell M00 is turned off at the activation of the word line WL0, the potential of the main bit line MBL2 increases because no current path L1 is formed. Subsequently, the potential of the main bit line MBL2 is sensed and the data reading operation of the memory cell M00 is finished. During the data reading operation of the memory cell M00, however, the above-mentioned leakage current paths L2 and L3 as a result of the simultaneous activation of the memory cells M01, M02, M03, and M04 by the word line WL0 cause that it takes a longer time to raise the potential of the main bit line MBL2. In other words, it is difficult for a conventional NOR-structured semiconductor device shown in FIG. 1 to achieve high-speed data reading operations. In some cases, the leakage current paths L2 and L3 even make the sensed potential of the main bit line MBL2 become such a low value that the memory cell M00 is falsely determined as a turned-on cell. Therefore, it is desirable to provide a NOR-structured semiconductor memory device with high-speed data reading operations and correct data determinations.

SUMMARY OF THE INVENTION

In view of the above-mentioned problems of the conventional NOR-structured semiconductor memory device, it is an object of the present invention to provide a novel NOR-structured semiconductor memory device capable of preventing the programming disturbance during programming operations.

It is another object of the present invention to provide a novel NOR-structured semiconductor memory device with high-speed data reading operations.

It is still another object of the present invention to provide a novel NOR-structured semiconductor memory device in which the data stored in memory cells are correctly determined.

According to the present invention, a NOR-structured semiconductor memory device is provided with a semiconductor memory cell array having a plurality of semiconductor memory cells. The plurality of semiconductor memory cells may consist of programmable cells, such as EPROM or Flash EEPROM. A plurality of bit lines are electrically connected to the semiconductor memory cell array and divided into at least four bit line groups. At least two bit lines of each bit line group of the at least four bit line groups are coupled to a main bit line through at least two bit line transistors, respectively. The main bit line serves as a common main bit line for the coupled at least two bit lines. Furthermore, the bit lines of the NOR-structured semiconductor memory device are arranged in such a way that at least four adjacent bit lines thereof are selected from four different bit line groups and coupled to four different main bit lines, respectively.

During programming operations, two adjacent bit lines of the four adjacent bit lines are supplied with a programming voltage while the other two adjacent bit lines are grounded. Therefore, the NOR-structured semiconductor memory device according to the present invention successfully prevents the programming disturbance because no leakage current path is formed.

During data reading operations, two adjacent bit lines of the four adjacent bit lines are supplied with a sense current while the other two adjacent bit lines are grounded. Therefore, the NOR-structured semiconductor memory device according to the present invention correctly determines the data stored in memory cells at a high speed because no leakage current path is formed.

BRIEF DESCRIPTION OF THE DRAWINGS

Above-mentioned and other objects, features, and advantages of the present invention will become apparent with reference to the following detailed descriptions and accompanying drawings, wherein.

DETAILED DESCRIPTION OF THE PREFERRED EMBODIMENTS

The preferred embodiments according to the present invention will be described in detail with reference to the drawings.

Figure 1:
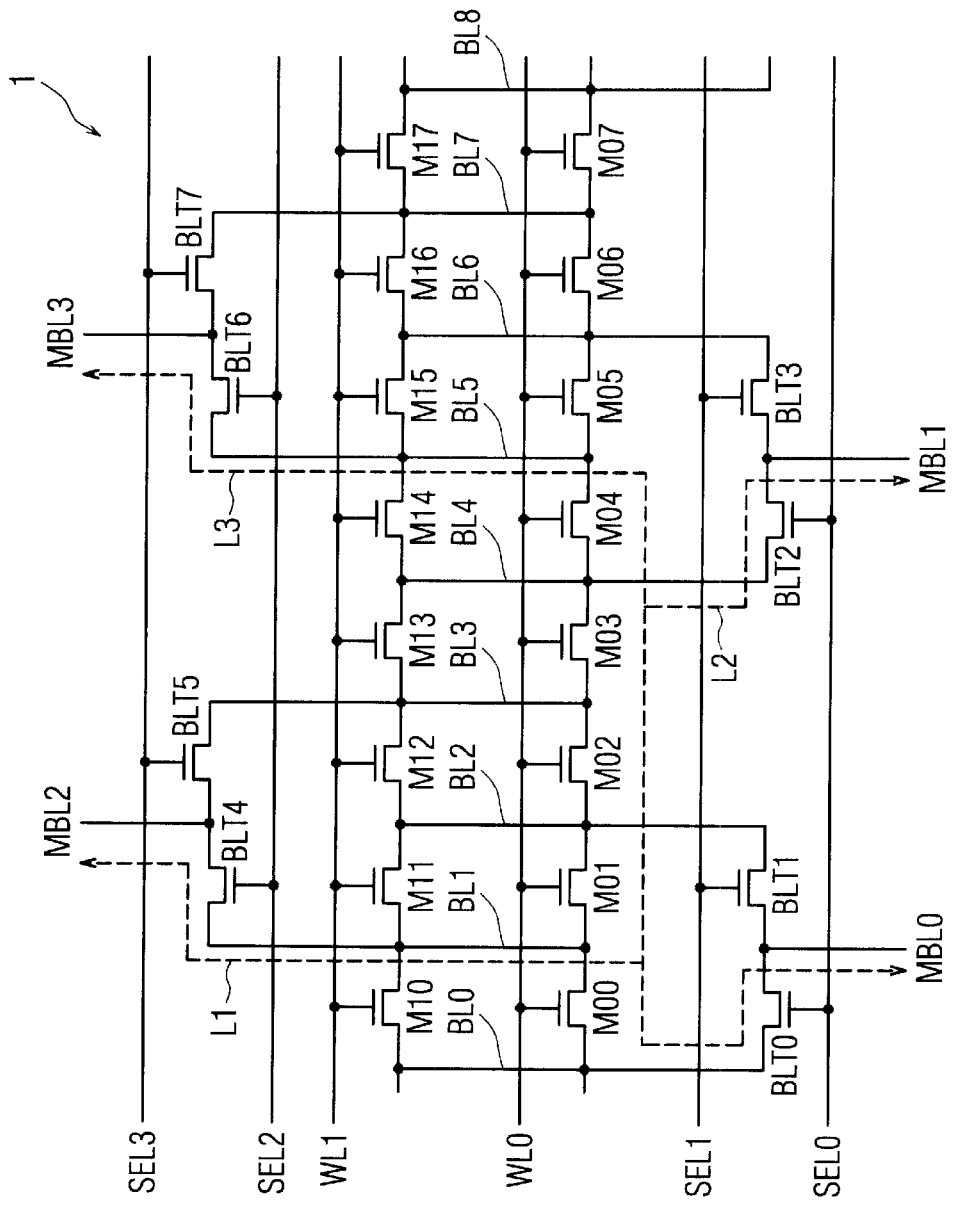
FIG. 1 is a schematic diagram showing a conventional NOR-structured semiconductor memory device.
Figure 2:
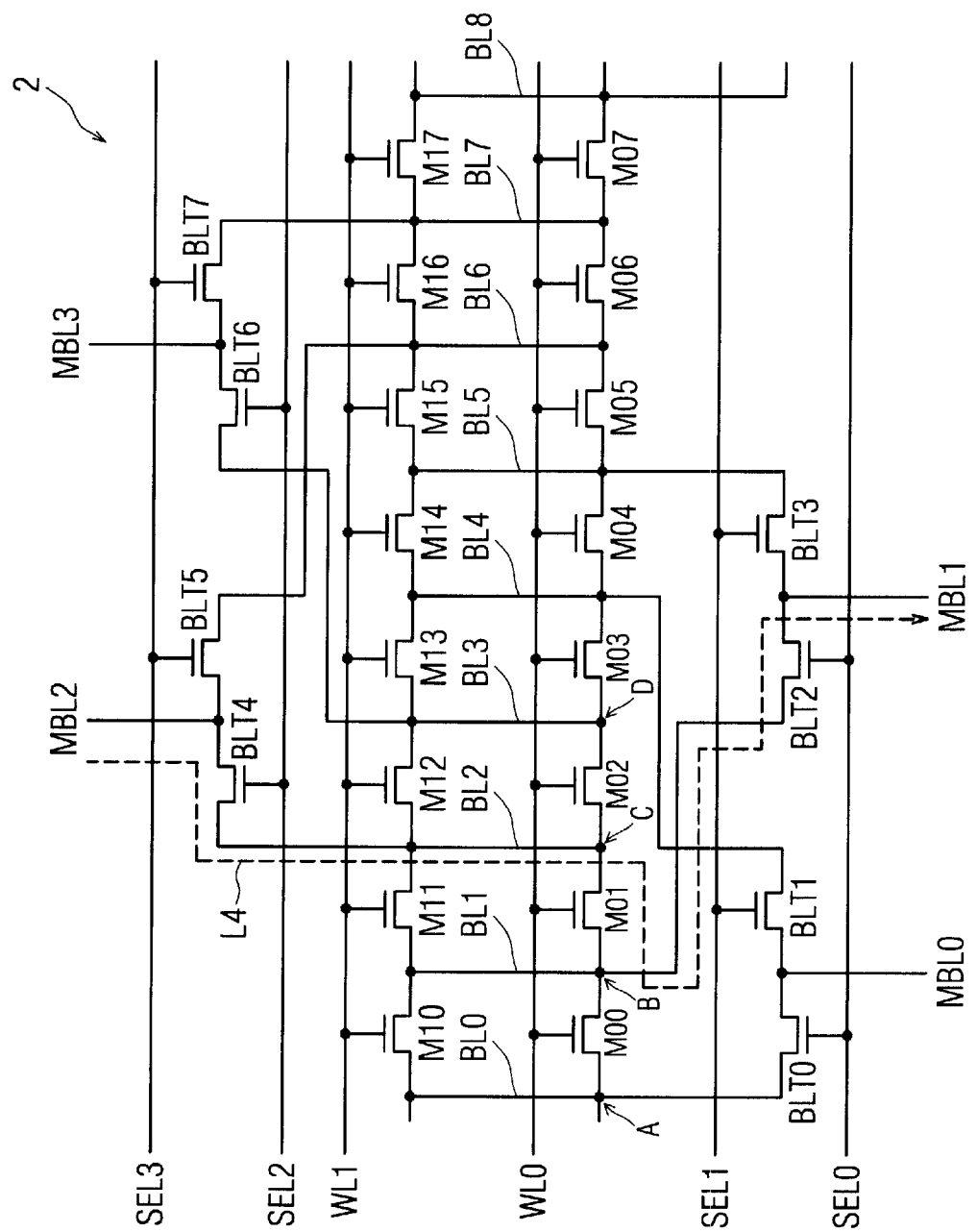
FIG. 2 is a schematic diagram showing a NOR-structured semiconductor memory device of an embodiment according to the present invention.

FIG. 2 is a schematic diagram showing a NOR-structured semiconductor memory device 2 of an embodiment according to the present invention. For the sake of descriptive simplicity, the NOR-structured memory device 2 shown in FIG. 2 includes a 2×8 memory cell array whose memory cells are programmable cells, such as EPROM or Flash EEPROM, and electrically connected to corresponding word lines and bit lines. It should be noted that the present invention is applicable to any NOR-structured semiconductor memory device regardless of the array size and programmability of the memory cell. More specifically, the present invention is applicable to a NOR-structured semiconductor memory device having an mxn programmable memory cell array wherein m and n are both natural numbers.

The memory cells arranged in a row are electrically connected in parallel to a word line while the memory cells arranged in a column are electrically connected in parallel to two adjacent bit lines. For example, memory cells M10 to M17 are arranged in such a way that the gate electrodes of them are electrically connected to a word line WL1. Memory cells M10 and M00 are arranged in such a way that the channel electrodes (i.e., source and drain electrodes) of them are electrically connected in parallel to two adjacent bit lines BL0 and BL1, respectively.

Referring to FIG. 2, bit lines BL0 and BL4 are coupled to a main bit line MBL0 through bit line transistors BLT0 and BLT1, respectively. Bit lines BL1 and BL5 are coupled to a main bit line MBL1 through bit line transistors BLT2 and BLT3, respectively. Similarly, bit lines BL2 and BL6 are coupled to a main bit line MBL2 through bit line transistors BLT4 and BLT5, respectively. Bit lines BL3 and BL7 are coupled to a main bit line MBL3 through bit line transistors BLT6 and BLT7, respectively. The bit line transistors BLT0 and BLT2 are electrically connected at gate electrodes to a selection line SEL0 while the bit line transistors BLT1 and BLT3 are electrically connected at gate electrodes to a selection line SEL1. Similarly, the bit line transistors BLT4 and BLT6 are electrically connected at gate electrodes to a selection line SEL2 while the bit line transistors BLT5 and BLT7 are electrically connected at gate electrodes to a selection line SEL3. Consequently, two bit line transistors coupled together to a main bit line are controlled by two different selection lines.

The NOR-structured semiconductor memory device according to the present invention is characterized in that at least four adjacent bit lines thereof are coupled to four different main bit lines through four different bit line transistors, respectively. Such a configuration of bit line connection can prevent the programming disturbance during programming operations and achieve high-speed data reading operations as well as correct data determinations.

For example, the four adjacent bit lines BL0, BL1, BL2, and BL3 are coupled to four different main bit lines MBL0, MBL1, MBL2, and MBL3 through four different bit line transistors BLT0, BLT2, BLT4, and BLT6, respectively, as shown in FIG. 2. Now assume that the memory cell M01 is to be programmed. The word line WL0 is activated and the selection lines SEL0 and SEL2 are activated to turn on the bit line transistors BLT2 and BLT4. Moreover, the selection lines SEL1 and SEL3 are deactivated to turn off the bit line transistors BLT3 and BLT5. At the same time, the main bit line MBL2 is supplied with a programming voltage and the main bit line MBLI is grounded. Therefore, the memory cell M01 is programmed through a current path L4 consisting of the main bit line MBL2, the bit line transistor BLT4, the bit line BL2, the bit line BL1, and the bit line transistor BLT2, and the main bit line MBL1.

In order to prevent the memory cells adjacent to the memory cell M01 (i.e., M00 and M02) from the programming disturbance, the programming voltage supplied to the main bit line MBL2 is also supplied to the main bit line MBL3 and the main bit line MBL0 is, like the main bit line MBL1, grounded. Because the bit line transistors BLT0 and BLT6 are, like the bit line transistors BLT2 and BLT4, turned on by the activation of the selection lines SEL0 and SEL2, respectively, nodes A and B are both at a substantially equal potential and nodes C and D are both at another substantially equal potential. As a result, there is no leakage current path formed through the memory cells M00 and M02. Therefore, The NOR-structured semiconductor memory device according to the present invention successfully prevents the programming disturbance during the programming operation.

Now assume that the memory cell M10 is subject to a data reading operation. The word line WL0 is activated and the selection lines SEL0 and SEL2 are activated to turn on the bit line transistors BLT2 and BLT4. Moreover, the selection lines SEL1 and SEL3 are deactivated to turn off the bit line transistors BLT3 and BLT5. At the same time, the main bit line MBL2 is supplied with a sense current and the main bit line MBL1 is grounded. According to the present invention, the sense current supplied to the main bit line MBL2 is also supplied to the main bit line MBL3 and the main bit line MBL0 is, like the main bit line MBL1, grounded. As a result, there is no leakage current path formed through the memory cells M00 and M02 since there is no potential difference between nodes A and B as well as between nodes C and D. Therefore, the potential of the main bit line MBL2 can increase at a high speed if the memory cell M00 is turned off at the activation of the word line WL0. The NOR-structured semiconductor memory device according to the present invention correctly determines the data stored in the memory cell M00 at a high speed.

Figure 3:
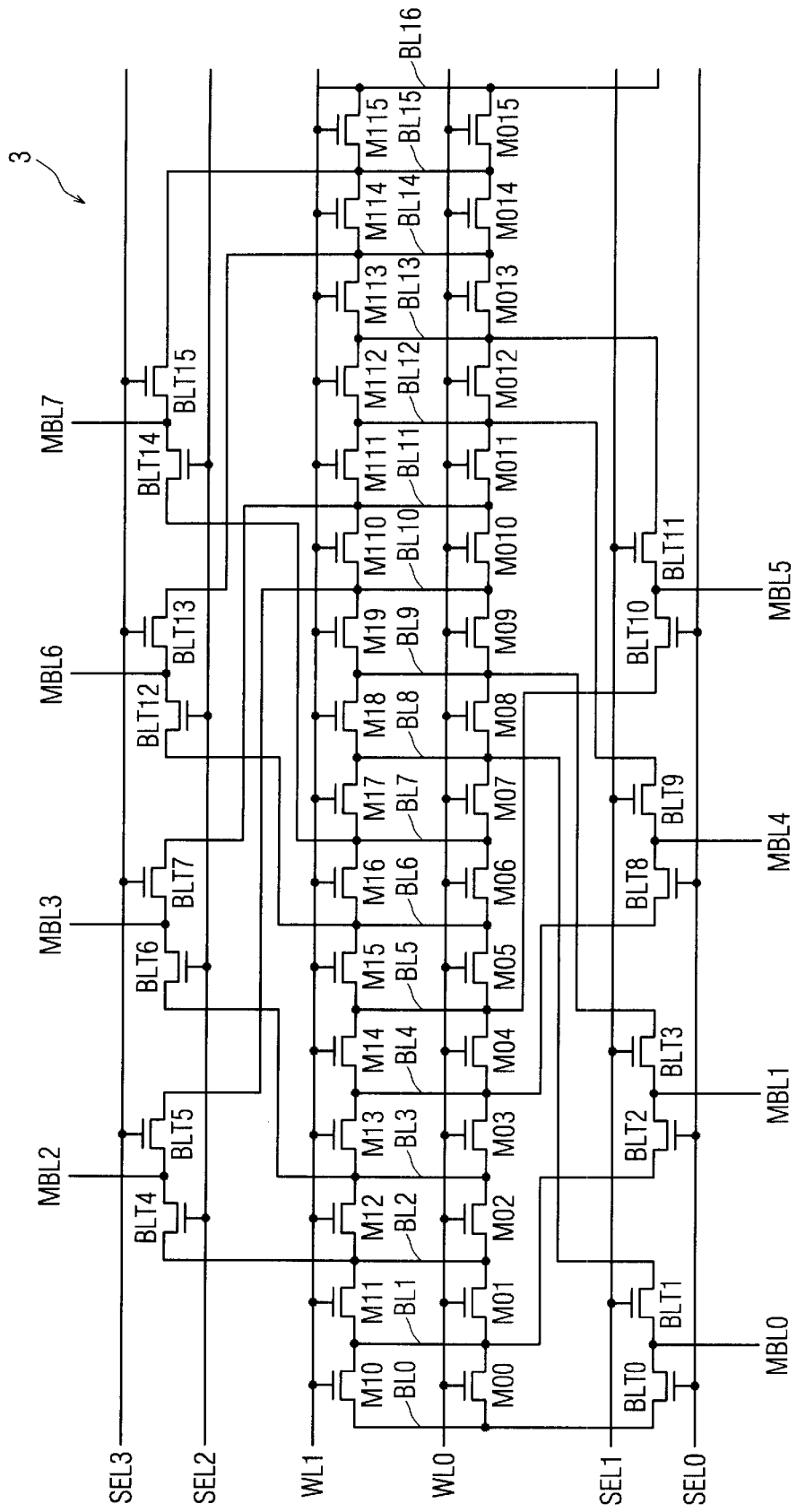
FIG. 3 is a schematic diagram showing a NOR-structured semiconductor memory device of another embodiment according to the present invention.

FIG. 3 is a schematic diagram showing a NOR-structured semiconductor memory device 3 of another embodiment according to the present invention. Like the embodiment shown in FIG. 2, at least four adjacent bit lines of the NOR-structured semiconductor memory device shown in FIG. 3 are coupled to four different main bit lines through four different bit line transistors, respectively. The difference between the embodiments shown in FIGS. 2 and 3 is described as follows.

Referring back to FIG. 2, one of two bit lines coupled to a common main bit line is separated from another by four columns of memory cells. In other words, there are three other bit lines arranged between two bit lines coupled to a common main bit line. For example, three bit lines BL1 to BL3 are arranged between two bit lines BL0 and BL4 coupled to a common main bit line MBL0. Referring to FIG. 3, however, one of two bit lines coupled to a common main bit line is separated from another by eight columns of memory cells. In other words, there are seven other bit lines arranged between two bit lines coupled to a common main bit line. For example, seven bit lines BL1 to BL7 are arranged between two bit lines BL0 and BL8 coupled to a common main bit line MBL0. It should be noted that the present invention is applicable to any NOR-structured semiconductor memory device in which one of two bit lines coupled to a common main bit line is separated from another by at least four columns of memory cells or, in other words, there are at least three other bit lines arranged between two bit lines coupled to a common main bit line.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A NOR-structured semiconductor memory device comprising:
    a semiconductor memory cell array having a plurality of semiconductor memory cells;
    a plurality of bit lines electrically connected to said semiconductor memory cell array and divided into at least four bit line groups;
    a plurality of bit line transistors divided into at least four bit line transistor groups in such a way that each group of said at least four bit line transistor groups corresponds to one of said at least four bit line groups;
    a plurality of main bit lines divided into at least four main bit line groups in such a way that each group of said at least four main bit line groups corresponds to one of said at least four bit line groups;
    wherein at least two bit lines of each bit line group of said at least four bit line groups are coupled to a main bit line of a corresponding main bit line group of said at least four main bit line groups through at least two bit line transistors of a corresponding bit line transistor group of said at least four bit line transistor groups, respectively; and
    at least four adjacent bit lines of the NOR-structured semiconductor memory device are selected from four different bit line groups and coupled to four different main bit lines, respectively.

2. A NOR-structured semiconductor memory device according to claim 1, wherein:
    said at least two bit line transistors coupled to said main bit line are controlled by at least two different selection lines, respectively.

3. A NOR-structured semiconductor memory device according to claim 1, wherein:
    said plurality of semiconductor memory cells consists of programmable memory cells.

4. A NOR-structured semiconductor memory device according to claim 1, wherein:
    during a programming operation, two adjacent bit lines of said four adjacent bit lines are supplied with a programming voltage through the main bit lines and bit line transistors coupled thereto, respectively, while the other two adjacent bit lines of said four adjacent bit lines are grounded through the main bit lines and bit line transistors coupled thereto, respectively.

5. A NOR-structured semiconductor memory device according to claim 1, wherein:
    during a data reading operation, two adjacent bit lines of said four adjacent bit lines are supplied with a sense current through the main bit lines and bit line transistors coupled thereto, respectively, while the other two adjacent bit lines of said four adjacent bit lines are grounded through the main bit lines and bit line transistors coupled thereto, respectively.

6. A NOR-structured semiconductor memory device according to claim 1, wherein:
    one of said at least two bit lines coupled to said main bit line is separated from another of said at least two bit lines by at least four columns of said semiconductor memory cells.

7. A NOR-structured semiconductor memory device according to claim 1, wherein:
    there are at least three other bit lines arranged between said at least two bit lines coupled to said main bit line.

* * * * *